(12) United States Patent
Roh et al.

(10) Patent No.: US 12,066,849 B2
(45) Date of Patent: Aug. 20, 2024

(54) SEMICONDUCTOR DEVICE AND MEMORY DEVICE COMPRISING THE SAME

(71) Applicant: Samsung Electronics Co., Ltd., Suwon-si (KR)

(72) Inventors: Kyoung Jun Roh, Hwaseong-si (KR); Jae Woo Park, Yongin-si (KR); Jun Han Choi, Suwon-si (KR); Myoung Bo Kwak, Seoul (KR); Jung Hwan Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 228 days.

(21) Appl. No.: 17/744,067

(22) Filed: May 13, 2022

(65) Prior Publication Data

US 2023/0057178 A1 Feb. 23, 2023

(30) Foreign Application Priority Data

Aug. 19, 2021 (KR) .......................... 10-2021-0109307

(51) Int. Cl.
| | |
|---|---|
| *G05F 1/56* | (2006.01) |
| *G11C 5/14* | (2006.01) |
| *G11C 7/10* | (2006.01) |
| *H03F 3/45* | (2006.01) |

(52) U.S. Cl.
CPC .............. *G05F 1/56* (2013.01); *G11C 5/147* (2013.01); *G11C 7/10* (2013.01); *H03F 3/45071* (2013.01)

(58) Field of Classification Search
CPC . G05F 1/56; G05F 1/561; G05F 1/562; G05F 1/573; G05F 1/5735; G05F 1/575; G11C 5/147; G11C 5/14; G11C 7/10; H03F 3/45071; H03F 3/45076; H03F 3/45
See application file for complete search history.

(56) References Cited

U.S. PATENT DOCUMENTS

| | | |
|---|---|---|
| 7,002,332 B2 | 2/2006 | Chen et al. |
| 7,227,404 B2 | 6/2007 | Mayega et al. |
| 9,146,569 B2 | 9/2015 | Li et al. |
| 9,263,098 B2 | 2/2016 | Yoo et al. |
| 9,344,000 B2 | 5/2016 | Kim et al. |
| 9,494,960 B2 | 11/2016 | Weerakoon et al. |
| 9,710,002 B2 | 7/2017 | Easwaran et al. |

(Continued)

FOREIGN PATENT DOCUMENTS

JP 2012185595 A 9/2012

*Primary Examiner* — Nguyen Tran
(74) *Attorney, Agent, or Firm* — Harness, Dickey & Pierce, P.L.C.

(57) ABSTRACT

A semiconductor device including an error amplifier configured to receive a voltage of an output node and a reference voltage, a flipped voltage follower (FVF) circuit configured to receive an output of the error amplifier and maintain the voltage of the output node at the reference voltage, and a bias current control circuit configured to receive first to third mode signals, control a magnitude of a bias current flowing through the FVF circuit based on the first to third mode signals, control the bias current of a first magnitude, based on the first mode signal, control the bias current of a second magnitude smaller than the first magnitude, based on the second mode signal, and control the bias current of a third magnitude smaller than the second magnitude, based on the third mode signal.

20 Claims, 16 Drawing Sheets

(56) References Cited

U.S. PATENT DOCUMENTS

| | | |
|---|---|---|
| 10,591,938 B1 | 3/2020 | Golara |
| 2013/0249616 A1* | 9/2013 | Priel .................. G11C 5/147 |
| | | 327/319 |
| 2016/0211751 A1* | 7/2016 | Kurozo ................ G05F 1/573 |
| 2022/0103142 A1* | 3/2022 | Gruber ............... H03F 3/45183 |

* cited by examiner

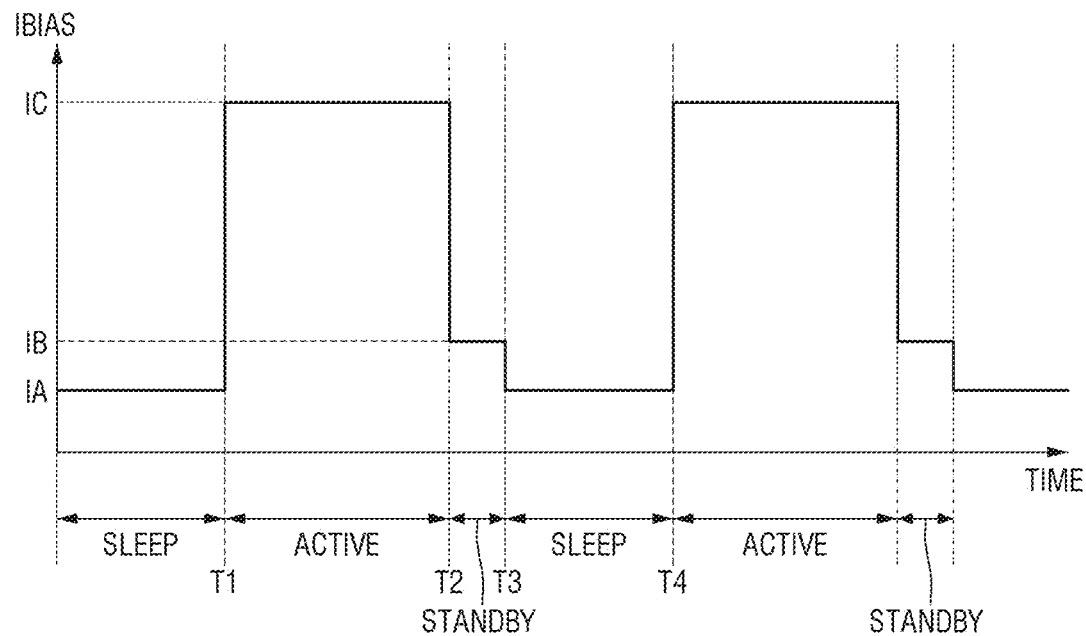

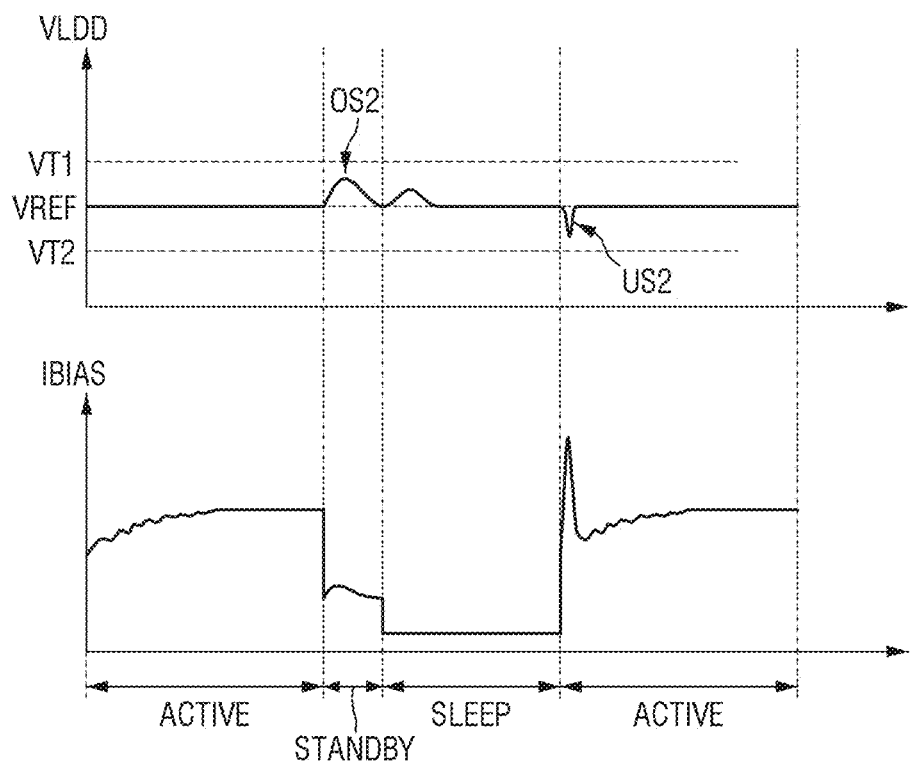

SEMICONDUCTOR DEVICE AND MEMORY DEVICE COMPRISING THE SAME

CROSS-REFERENCE TO RELATED APPLICATIONS

This application claims priority from Korean Patent Application No. 10-2021-0109307 filed on Aug. 19, 2021 in the Korean Intellectual Property Office, the disclosure of which is incorporated herein by reference in its entirety.

BACKGROUND

1. Technical Field

The present disclosure relates to semiconductor devices and memory devices including the same.

2. Description of the Related Art

An LDO (Low Drop Out) regulator is a regulator which is used under a condition that a difference between an input voltage and an output voltage is small. The LDO regulator is abbreviated as an LDO.

In recent years, a LDO regulator including a FVF (Flipped Voltage Follower) has been used to improve an area efficiency of elements. Incidentally, when the element supplied with an output voltage of such an LDO regulator operates while being converted into a sleep mode and an active mode to reduce power consumption, there is a problem that the output voltage of the LDO regulator is not maintained constant and becomes unstable. Therefore, there is a desire for research for improving this problem.

SUMMARY

Aspects of the present disclosure provide semiconductor devices capable of maintaining a stable voltage.

Aspects of the present disclosure also provide memory devices including a semiconductor device capable of maintaining a stable voltage.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to some aspects of the present disclosure, there is provided a semiconductor device comprises an error amplifier configured to receive input of a voltage of an output node and a reference voltage, a flipped voltage follower (FVF) circuit configured to receive an output of the error amplifier and maintain the voltage of the output node at the reference voltage, and a bias current control circuit configured to receive a first mode signal, a second mode signal, and a third mode signal, control a magnitude of a bias current flowing through the FVF circuit based on the first mode signal, the second mode signal, and the third mode signal, control the bias current of a first magnitude to flow through the FVF circuit, in response to the first mode signal, control the bias current of a second magnitude smaller than the first magnitude to flow through the FVF circuit, in response to the second mode signal, and control the bias current of a third magnitude smaller than the second magnitude to flow through the FVF circuit, in response to the third mode signal.

According to some aspects of the present disclosure, there is provided a semiconductor device comprises an error amplifier configured to receive input of a voltage of an output node and a reference voltage, a first transistor configured to maintain the voltage of the output node at the reference voltage, using a power supply voltage based on an output of the error amplifier, and a bias current control circuit configured to receive a first mode signal, a second mode signal, and a third mode signal, control a magnitude of a bias current flowing through the first transistor based on the first mode signal, the second mode signal, and the third mode signal, control the bias current of a first magnitude to flow through the first transistor, in response to the first mode signal, control the bias current of a second magnitude smaller than the first magnitude to flow through the first transistor, in response to the second mode signal, and control the bias current of a third magnitude smaller than the second magnitude to flow through the first transistor, in response to the third mode signal.

According to some aspects of the present disclosure, there is provided a memory device comprises a memory cell, a data input/output buffer configured to buffer data to be written to the memory cell or buffers data read from the memory cell, and a regulator in the data input/output buffer and is configured to receive first and second signals, wherein the regulator includes an error amplifier configured to receive an input of a voltage of an output node and a reference voltage, an FVF circuit configured to receive an output of the error amplifier and maintains the voltage of the output node at the reference voltage, and a bias current control circuit configured to control a magnitude of a bias current flowing through the FVF circuit, control the bias current of a first magnitude to flow through the FVF circuit, in response to the first signal of a first level, control the bias current of a second magnitude smaller than the first magnitude to flow through the FVF circuit, in response to the first signal of a second level different from the first level and the second signal of the first level, and the bias current control circuit controls the bias current of a third magnitude smaller than the second magnitude to flow through the FVF circuit, in response to the first signal of the second level and the second signal of the second level.

BRIEF DESCRIPTION OF THE DRAWINGS

The above and other aspects and features of the present disclosure will become more apparent by describing in detail exemplary embodiments thereof referring to the attached drawings, in which:

FIGS. 3 and 4 are diagrams for explaining the operation of the semiconductor device according to some example embodiments;

FIGS. 5 and 6 are diagrams for explaining the effect of the semiconductor device according to some example embodiments;

FIG. 7 is a diagram for explaining the operation of the semiconductor device according to some example embodiments;

DETAILED DESCRIPTION OF THE EMBODIMENTS

Hereinafter, example embodiments according to the technical ideas of the present disclosure will be described referring to the accompanying drawings.

Figure 1:
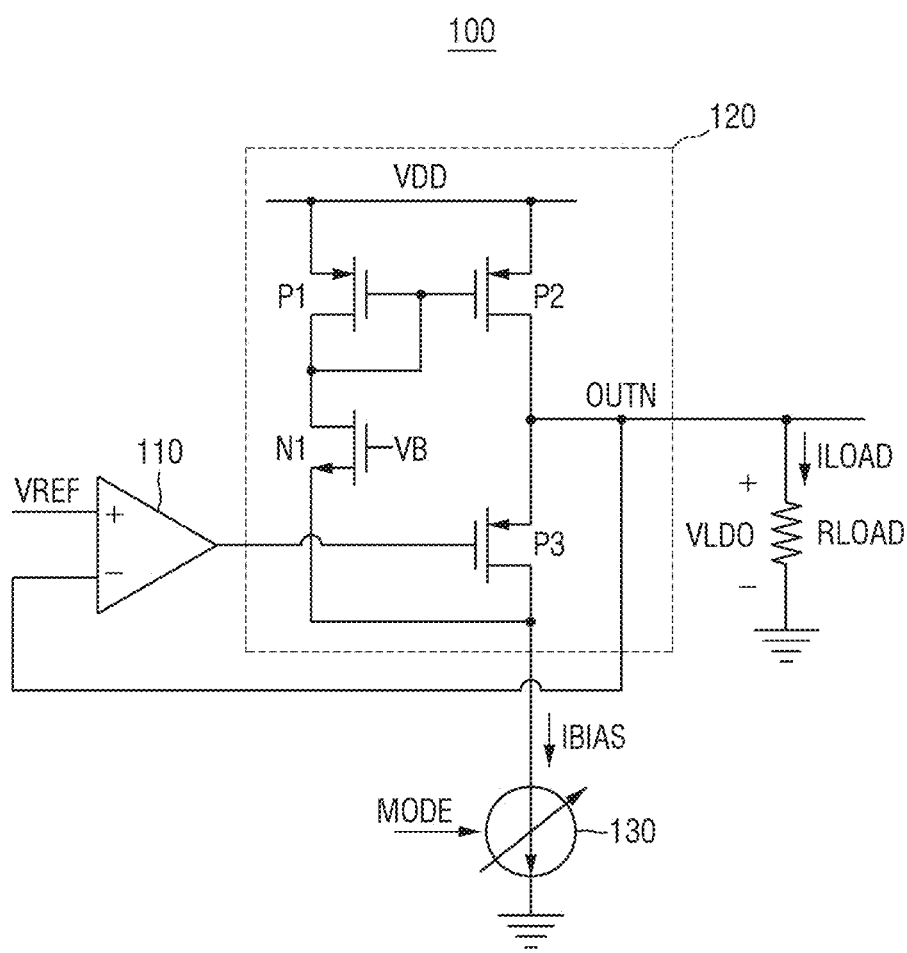
FIG. 1 is a diagram for explaining a semiconductor device according to some example embodiments.
Figure 2:
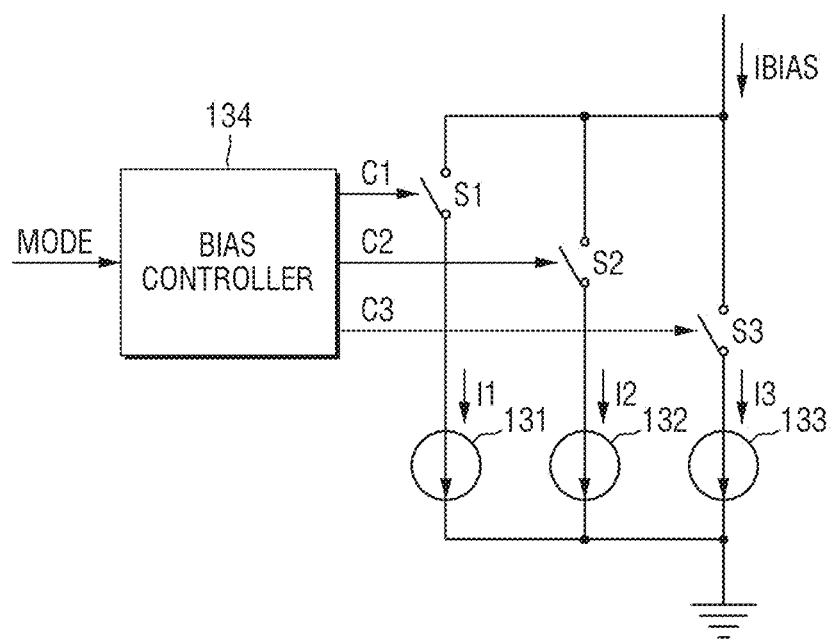
FIG. 2 is a diagram for explaining a bias current control circuit of FIG. 1.

FIG. 1 is a diagram for explaining a semiconductor device according to some example embodiments. FIG. 2 is a diagram for explaining a bias current control circuit of FIG. 1.

Referring to FIG. 1, a semiconductor device 100 may include an error amplifier 110, an FVF (Flipped Voltage Follower) circuit 120, and a bias current control circuit 130.

In some example embodiments, the semiconductor device 100 may include a regulator that maintains an output voltage VLDO applied to a load resistance VLOAD of a load (e.g., another semiconductor device) through an output node OUTN at a reference voltage VREF, using a power supply voltage VDD. In some example embodiments, the regulator may be configured to provide, or output, an output voltage VLDO applied to a load resistance VLOAD of a load. Components may be configured to perform the actions described herein.

Further, in some example embodiments, the semiconductor device 100 may be an LDO (Low Drop Out) regulator which is used under a condition that a difference between an input voltage (e.g., the power supply voltage VDD) and an output voltage (e.g., the output voltage VLDO) is small.

The error amplifier 110 may receive the voltage of the output node OUTN (e.g., the output voltage VLDO and the reference voltage VREF), and may output a signal corresponding to a difference between them. The output signal of the amplifier 110 may be supplied to a gate electrode of a transistor P3 as shown. The transistor P3 is gated to the output signal of the error amplifier 110, and may adjust the output voltage VLDO so that the magnitude of the output voltage VLDO becomes the same, or substantially the same, as the magnitude of the reference voltage VREF.

Although the drawings show that, for convenience of explanation, the output node OUTN and the error amplifier 110 are directly connected, the example embodiments are not limited thereto. In some example embodiments, a distribution resistor may be placed at the output node OUTN, and the error amplifier 110 may receive the output voltage VLDO distributed through such a distribution resistor as an input.

The FVF circuit 120 may receive the output of the error amplifier 110 and maintain the output voltage VLDO of the output node OUTN at the reference voltage VREF. Further, the FVF circuit 120 may supply a load current ILOAD to the load.

The FVF circuit 120 may include a plurality of transistors P1, P2, P3, and N1.

A source terminal of the transistor P1 and a source terminal of the transistor P2 may be connected to the power supply voltage VDD. A gate electrode of the transistor P1 and a gate electrode of the transistor P2 may be connected to each other. The gate electrode of the transistor P1 and a drain terminal of the transistor P1 may be connected to each other.

The drain terminal of the transistor P2 may be connected to the source terminal of the transistor P3. The transistor P2 may perform a function of compensating for the operation of the transistor P3.

The drain terminal of the transistor P1 may be connected to the drain terminal of the transistor N1. The transistor N1 may be turned on or off by receiving a control signal VB at the gate electrode thereof to perform a function of compensating for the operation of the transistor P3.

The source terminal of the transistor N1 may be connected to the drain terminal of the transistor P3.

In some example embodiments, the transistors P1, P2 and P3 may include a P-type transistor, and the transistor N1 may include an N-type transistor. However, some example embodiments are not limited thereto, and the conductive type of the transistors P1, P2, P3, and N1 may be modified differently as needed or desired.

The bias current control circuit 130 may control the magnitude of the bias current IBIAS flowing through the FVF circuit 120 depending on the operating mode of the semiconductor device 100.

The semiconductor device 100 may operate in the first to third modes (a first mode, a second mode, or a second mode) depending on the operating state of the load connected to the output node OUTN.

The first mode may be, for example, an active mode in which the load performs a dynamic operation. For example, when the semiconductor device 100 is included in the memory device, the active mode may be a mode in which the memory device performs a read operation or a write operation.

The third mode may be, for example, a sleep mode in which the load performs a static operation. For example, when the semiconductor device 100 is included in the memory device, the sleep mode may be a mode in which the memory device waits for command reception from the host.

The second mode may be, for example, a standby mode in which the load is switched from a mode of performing the dynamic operation to a mode of performing the static operation. For example, when the semiconductor device 100 is included in the memory device, the standby mode may be a mode for a certain period of time after the memory device completes the read operation or the write operation. A more specific explanation thereof will be provided below.

The semiconductor device 100 may output a load current ILOAD of a first magnitude to the load in a first mode, output the load current ILOAD of a second magnitude smaller than the first magnitude to the load in a second mode, and output the load current ILOAD of a third magnitude smaller than the second magnitude to the load in a third mode, since a large amount of current (e.g., the first and second magnitudes of the load current ILOAD) is not required for the load.

The bias current control circuit 130 determines the operating mode of the semiconductor device 100 on the basis of the mode signal provided from the outside (e.g., received by the semiconductor device 100), and may control the magnitude of the bias current IBIAS flowing through the FVF circuit 120 on the basis of such a mode signal.

In response to the active mode signal indicating that the semiconductor device 100 operates in the active mode, the bias current control circuit 130 may control the bias current IBIAS of the first magnitude to flow through the FVF circuit 120.

Further, in response to the standby mode signal indicating that the semiconductor device 100 operates in the standby mode, the bias current control circuit 130 may control the bias current IBIAS of the second magnitude smaller than the first magnitude to flow through the FVF circuit 120. Here, since the standby mode is a mode in which the load does not perform the dynamic operation, the bias current IBAS of large magnitude does not need to flow through the FVF circuit 120. Therefore, the magnitude of the bias current IBAS flowing through the FVF circuit 120 in the standby mode may be smaller than half the magnitude of the bias current IBAS flowing through the FVF circuit 120 in the active mode. However, some example embodiments are not limited thereto.

Further, in response to the sleep mode signal indicating that the semiconductor device 100 operates in the sleep mode, the bias current control circuit 130 may control the bias current IBIAS of the third magnitude smaller than the second magnitude to flow through the FVF circuit 120. Here, the sleep mode is a mode in which the load performs a static operation and which requires almost no load current ILOAD. Therefore, it is only necessary, or may be beneficial, to control the bias current IBAS of a small, or very small magnitude to flow through the FVF circuit 120. Therefore, a sum of the magnitude of the bias current IBAS flowing through the FVF circuit 120 in the standby mode and the magnitude of the bias current IBAS flowing through the FVF circuit 120 in the sleep mode may be smaller than the magnitude of the bias current IBAS flowing through the FVF circuit 120 in the active mode. However, some example embodiments are not limited thereto.

Referring to FIG. 2, in order to perform such an operation, the bias current control circuit 130 may include a bias controller 134, a plurality of current sources 131, 132 and 133, and switches S1, S2 and S3.

A current source 131 may output a first current I1, the current source 132 may output the second current I2, and the current source 133 may output the third current I3.

The bias controller 134 may output the control signals C1, C2 and C3 according to the provided mode signal. The control signal C1 may be used to control the switch S1, the control signal C2 may be used to control the switch S2, and the control signal C3 may be used to control the switch S3.

In some example embodiments, each of the plurality of current sources 131, 132 and 133 may be implemented as a current mirror (e.g., they may each be a current mirror). For example, the current source 131 may be implemented as P (P is a natural number) current mirror circuits, the current source 132 may be implemented as Q (Q is a natural number) current mirror circuits, and the current source 133 may be implemented as R (R is a natural number) current mirror circuits.

In some example embodiments, the values of P, Q and R may be the same, or substantially the same, as each other. In this case, the magnitudes of the first to third (first, second and third) currents I1, I2, and I3 may be the same, or substantially the same, as each other.

Furthermore, in some example embodiments, the values of P, Q and R may differ from each other. For example, P may be greater than Q, and Q may be greater than R. In this case, the magnitude of the first current I1 may be greater than the magnitude of the second current I2, and the magnitude of the second current I2 may be greater than the magnitude of the third current I3.

Furthermore, in some example embodiments, the plurality of current sources 131, 132 and 133 may be integrated and implemented in a single circuit. In FIG. 2, although a plurality of current sources 131, 132 and 133 are shown separately from each other for convenience of explanation, if necessary or desired, the plurality of current sources 131, 132 and 133 may be incorporated and implemented into a single circuit. For example, among a plurality of constant mirror circuits, some current mirror circuits (for example, P current mirror circuits) operate as a current source 131, and other (for example, Q current mirror circuits) current mirror circuits may operate as the current source 132, and the remaining current mirror circuits (for example, R current mirror circuits) may operate as the current source 133.

Hereinafter, the operation of the semiconductor device 100 will be described referring to FIGS. 3 and 4.

FIGS. 3 and 4 are diagrams for explaining the operation of the semiconductor device according to some example embodiments.

Referring to FIGS. 1 to 4, the semiconductor device 100 that was operating in the sleep mode operates in the active mode at the first time point T1. Accordingly, the bias controller 134 is provided with an active mode signal (e.g., the bias controller 134 receives the active mode signal).

Since the load requires a large amount of load current (ILOAD) in the active mode, the bias current control circuit 130 increases the bias current IBIAS flowing through the FVF circuit 120 so that the active bias current IC of large magnitude flows through the FVF circuit 120.

The bias controller 134 generates the control signals C1, C2, and C3 that turn on the switches S1, S2, and S3 in response to the active mode signal, and all the respective switches S1, S2, and S3 are turned on accordingly. As a result, the current sources 131, 132 and 133 are all activated, and the bias current IBIAS becomes the same, or substantially the same, as the sum of the first to third currents I1, I2, and I3. That is, the active bias current IC is determined by the sum of the first to third currents I1, I2, and I3.

Referring to FIGS. 1 to 4 again, the semiconductor device 100 that was operating in the active mode operates in the standby mode at the second time point T2. Accordingly, the bias controller 134 is provided with a standby mode signal (e.g., the bias controller 134 receives the standby mode signal).

Because the load does not require a large amount of load current ILOAD in the standby mode (e.g., the load requires less current in standby mode than in active mode), the bias current control circuit 130 reduces the bias current IBIAS flowing through the FVF circuit 120 so that the standby bias current IB of small magnitude flows through the FVF circuit 120.

In response to the standby mode signal, the bias controller 134 generates a control signal C1 that turns off the switch S1 and control signals C2 and C3 that turn on the switches S2 and S3. Accordingly, the switch S2 is turned off and the switches S2 and S3 are turned on. As a result, the current source 131 is deactivated, the current sources 132, 133 are activated, and the bias current IBIAS becomes the same, or substantially the same, as the sum of the second and third currents I2 and I3. That is, the standby bias current IB is determined by the sum of the second current I2 and the third current I3.

In some example embodiments, the magnitude of such standby bias current IB may be less than half the magnitude of the active bias current IC. However, some example embodiments are not limited thereto.

Referring to FIGS. 1 to 4 again, the semiconductor device 100 that was operating in the standby mode operates in the sleep mode at a third time point T3. Accordingly, a sleep mode signal is provided to the bias controller 134 (e.g., the bias controller 134 receives the sleep mode signal).

Because the load requires little or very little load current ILOAD in the sleep mode (e.g., the load requires less current in sleep mode than in standby mode), the bias current control circuit 130 reduces the bias current IBIAS flowing through the FVF circuit 120 so that the slip bias current IA of a small, or a very small magnitude flows through the FVF circuit 120.

The bias controller 134 generates control signals C1 and C2 for turning off the switches S1 and S2, and a control signal C3 for turning on the switch S3 in response to the sleep mode signal. Accordingly, the switches S1 and S2 are turned off, and the switch S3 is turned on. As a result, the current source 131 and the current source 132 are deactivated, the current source 133 is activated, and the bias current IBIAS becomes the same, or substantially the same, as the third current I3. That is, the slip bias current IA is determined by the third current I3. In some example embodiments, the magnitude of such slip bias current IA may be small or very small compared to the magnitude of the active bias current IC. The magnitude of the sum of the slip bias current IA and the standby bias current IB may be smaller than the magnitude of the active bias current IC.

In some example embodiments, while the semiconductor device 100 is operating in the standby mode, the standby bias current IB of a constant magnitude may be maintained for a certain period of time, as shown. That is, in some example embodiments, the magnitude of the bias current IBIAS flowing through the FVF circuit 120 does not increase or decrease linearly, but the magnitude of the current changes in a stepwise manner depending on the operating mode.

Referring to FIGS. 1 to 4, the semiconductor device 100 that was operating in the sleep mode operates in the active mode at the fourth time point T4. Accordingly, the bias controller 134 is provided with an active mode signal.

Since a large amount of load current ILOAD is required for the load again in the active mode, the bias current control circuit 130 increases the bias current IBIAS flowing through the FVF circuit 120 so that the active bias current IC of a large magnitude flows through the FVF circuit 120.

The bias controller 134 generates control signals C1, C2, and C3 that turn on the switches S1, S2, and S3 in response to the active mode signal, and all the respective switches S1, S2, and S3 are turned on accordingly. As a result, the current sources 131, 132 and 133 are all activated, and the bias current IBIAS becomes the same, or substantially the same, as the sum of the first to third currents I1, I2, and I3. That is, the active bias current IC is determined again by the sum of the first to third currents I1, I2, and I3. The semiconductor device 100 may operate through repetition of such an operation.

Hereinafter, the effects of the semiconductor device according to some example embodiments will be described referring to FIGS. 5 and 6.

Figure 5:
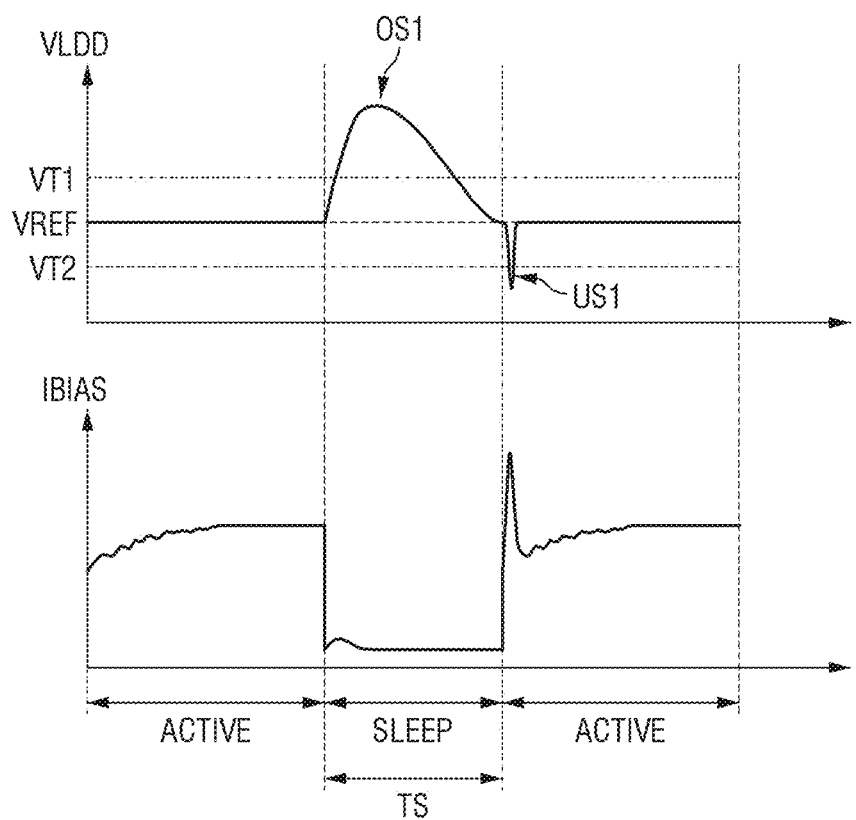

FIGS. 5 and 6 are diagrams for explaining the effect of the semiconductor device according to some example embodiments.

First, FIG. 5 is a graph showing a change in output voltage VLDO and a change in bias current IBIAS of a semiconductor device that does not have a standby mode between the active mode and the sleep mode, unlike the above-mentioned example embodiments.

Referring to FIG. 5, the bias current IBIAS flowing through the FVF circuit of the semiconductor device decreases sharply, while entering the sleep mode from the active mode. As a result, overshooting OS1 in which the voltage suddenly rises is generated in the output voltage VLDO of the semiconductor device, and then, the output voltage VLDO drops.

On the other hand, in contrast, the bias current IBIAS flowing through the FVF circuit of the semiconductor device increases sharply, while entering the active mode from the sleep mode. As a result, undershooting US1 (for example, a voltage droop) in which the voltage suddenly drops is generated in the output voltage VLDO of the semiconductor device, and then, the output voltage VLDO rises.

In particular, as a result of conducting multiple experiments, when the time staying in the sleep mode TS is about or exactly 200 ns or less, such a voltage droop phenomenon is observed, and in particular, when the time staying in the sleep mode TS is about or exactly 100 ns or less, it was observed that a considerable magnitude of voltage droop phenomenon occurred.

Referring to FIG. 1, such overshooting OS1 and undershooting US1 may be explained in such a manner that, as the bias current IBIAS and the load current ILOAD sharply decrease, the voltage of the output node OUTN greatly rises in the overshooting OS1 form, the gate voltage of the transistor P3 drops in the feedback process through the error amplifier 110 to compensate for this, and undershooting US1 in the form of a voltage droop occurs when entering the active mode again.

The regulator may maintain its reliability only when operating so that the output voltage VLDO is output within permissible errors VT1 and VT2 on the basis of the reference voltage VREF. However, such overshooting OS1 and undershooting US1 may be factors that reduce the reliability.

Next, FIG. 6 is a graph showing a change in the output voltage VLDO and a change in the bias current IBIAS of the semiconductor device 100 according to some example embodiments.

Referring to FIG. 6, in the semiconductor device 100 according to some example embodiments, the standby mode exists before entering the sleep mode from the active mode, and the bias current IBIAS flowing through the FVF circuit 120 does not sharply decrease compared to the semiconductor devices described above referring to FIG. 5, but changes in a stepwise manner depending on the operating mode. As a result, a sudden voltage rise of the output node OUTN may be prevented, the output voltage VLDO may be output within the permissible errors VT1 and VT2 on the basis of the reference voltage VREF, and stable voltage maintenance is enabled.

FIG. 7 is a diagram for explaining the operation of the semiconductor device according to some example embodiments.

Hereinafter, differences from the above-mentioned contents will be mainly described.

Referring to FIGS. 2, 3 and 7, in some example embodiments, the bias controller 134 generates a control signal C1 which turns on the switch S1 and control signals C2 and C3 which turns off the switches S2 and S3, in response to the active mode signal at the first time point T1 of FIG. 3. Accordingly, the switch S1 is turned on and the switches S2 and S3 are turned off. As a result, the current source 131 is activated, the current sources 132 and 133 are deactivated, and the bias current IBIAS becomes the same, or substantially the same, as the first current I1. That is, the active bias current IC is determined by the first current I1.

Next, the bias controller 134 generates a control signal C2 that turns on the switch S2, and control signals C1 and C3 that turn off the switches S1 and S3 in response to the standby mode signal at the second time point T2 of FIG. 3. Accordingly, the switch S2 is turned on and the switches S1 and S3 are turned off. As a result, the current source 132 is activated, the current sources 131 and 133 are deactivated, and the bias current IBIAS becomes the same, or substantially the same, as the second current I2. That is, the standby bias current IB is determined by the second current I2, and in this case, the magnitude of the second current I2 is smaller than the magnitude of the first current I1. In some example embodiments, the magnitude of the second current I2 may be less than half the magnitude of the first current I1.

Next, the bias controller 134 generate a control signal C3 that turns on the switch S3, and control signals C1 and C2 that turn off the switches S1 and S2 in response to the sleep mode signal at the third time point T3 of FIG. 3. As a result, the switch S3 is turned on and the switches S1 and S2 are turned off. As a result, the current source 133 is activated, the current sources 131 and 132 are deactivated, and the bias current IBIAS becomes the same, or substantially the same, as the third current I3. That is, the slip bias current IA is determined by the third current I3, and in this case, the magnitude of the third current I3 is smaller than the magnitude of the second current I2. In some example embodiments, the magnitude of the sum of the second current I2 and the third current I3 may be smaller than the magnitude of the first current I1.

Next, the bias controller 134 generates the control signal C1 that turns on the switch S1 and control signals C2 and C3 that turn off the switches S2 and S3 in response to the active mode signal at the fourth time point T4 of FIG. 3. Accordingly, the switch S1 is turned on and the switches S2 and S3 are turned off. As a result, the current source 131 is activated, the current sources 132 and 133 are deactivated, and the bias current IBIAS becomes the same, or substantially the same, as the first current I1. That is, the active bias current IC is determined again by the first current I1.

Figure 8:
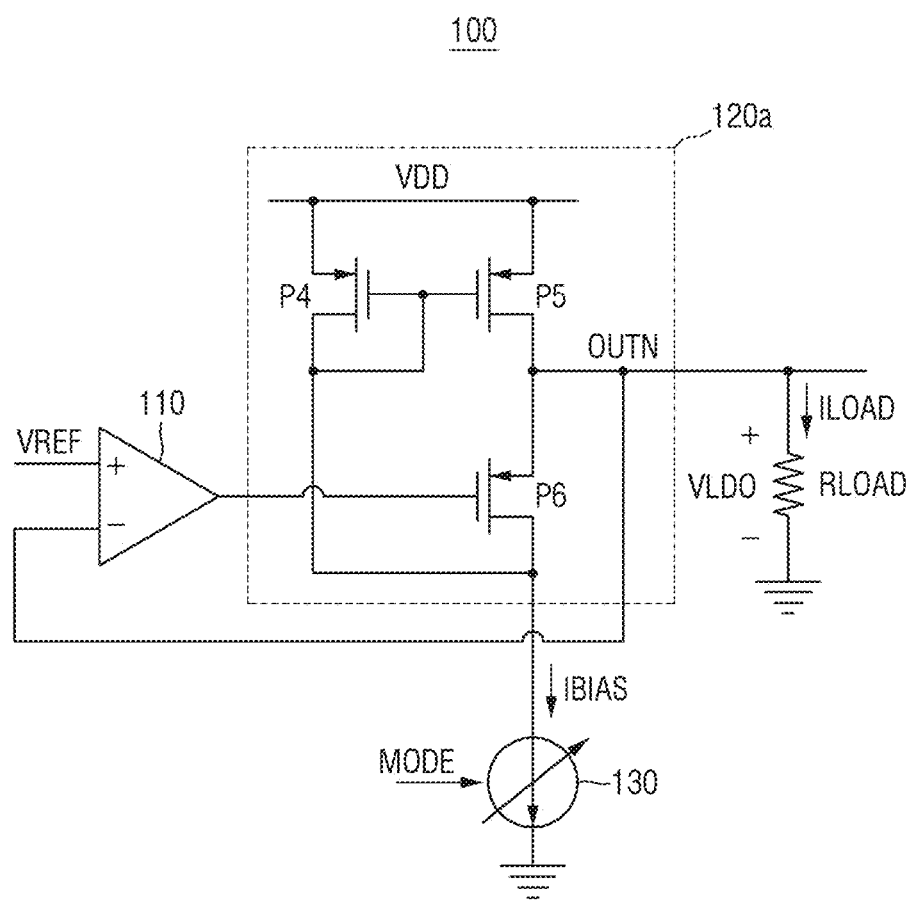
FIG. 8 is a diagram for explaining the semiconductor device according to some example embodiments.

FIG. 8 is a diagram for explaining a semiconductor device according to some example embodiments. Hereinafter, parts different from those of the above-described embodiments will be mainly described.

Referring to FIG. 8, a FVF circuit 120a of the semiconductor device according to some example embodiments may include three transistors P4, P5 and P6.

A source terminal of a transistor P4 and a source terminal of a transistor P5 are connected to the power supply voltage VDD. A gate electrode of the transistor P4 and a gate electrode of the transistor P5 may be connected to each other. The gate electrode of the transistor P4 and the drain terminal of the transistor P4 may be connected to each other.

A drain terminal of the transistor P5 may be connected to a source terminal of the transistor P6. The transistor P5 may perform a function of compensating for the operation of the transistor P6.

The drain terminal of the transistor P4 may be connected to the drain terminal of the transistor P6. In some example embodiments, the transistors P4, P5 and P6 may include P-type transistors. However, some example embodiments are not limited thereto, and the conductive type of the transistors P4, P5, and P6 may be modified differently as needed or desired.

That is, the FVF circuit 120a of the semiconductor device according to some example embodiments may be implemented in a form in which the transistor N1 is omitted in the FVF circuit 120 shown in FIG. 1.

Figure 9:
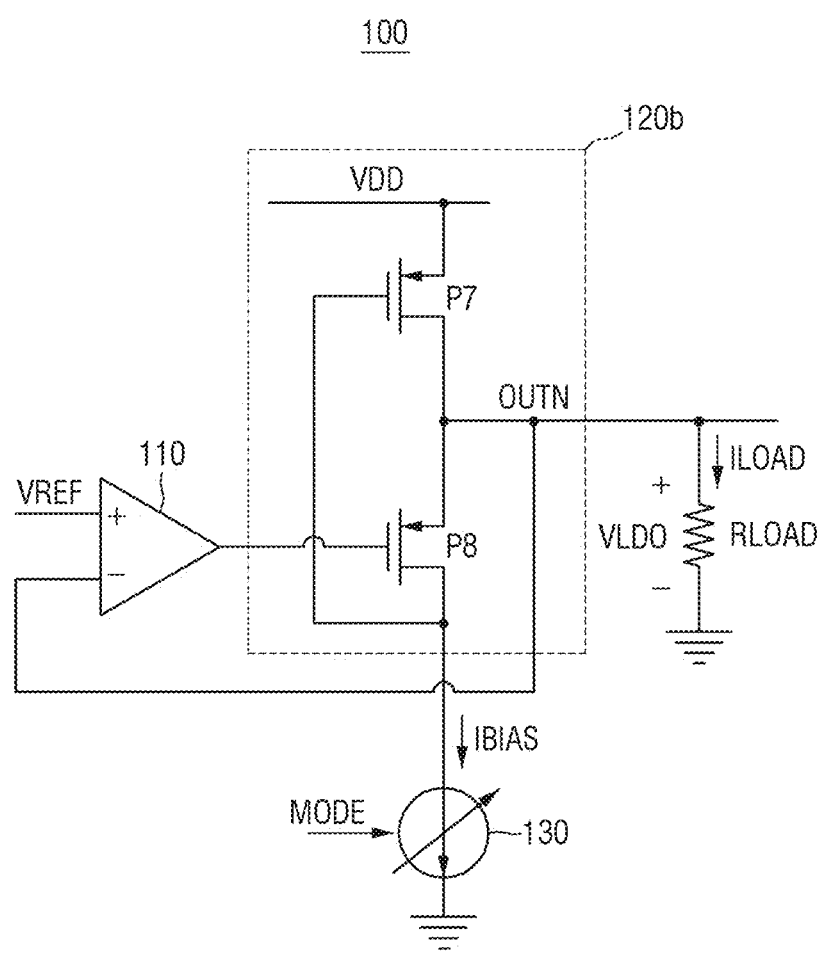
FIG. 9 is a diagram for explaining the semiconductor device according to some example embodiments.

FIG. 9 is a diagram for explaining a semiconductor device according to some example embodiments. Hereinafter, parts different from those of the above-described embodiments will be mainly described.

Referring to FIG. 9, a FVF circuit 120b of the semiconductor device according to some example embodiments may include two transistors P7 and P8.

A source terminal of a transistor P7 may be connected to the power supply voltage VDD. A drain terminal of the transistor P7 may be connected to a source terminal of a transistor P8. The transistor P7 may perform a function of compensating for the operation of the transistor P8.

The drain terminal of the transistor P8 may be connected to the gate electrode of the transistor P7. In some example embodiments, the transistors P7 and P8 may include P-type transistors. However, some example embodiments are not limited thereto, and the conductive type of the transistors P7 and P8 may be modified differently as needed or desired.

That is, the FVF circuit 120b of the semiconductor device according to some example embodiments may be implemented in a form in which the transistor P4 is omitted from the FVF circuit 120a shown in FIG. 8.

Figure 10:
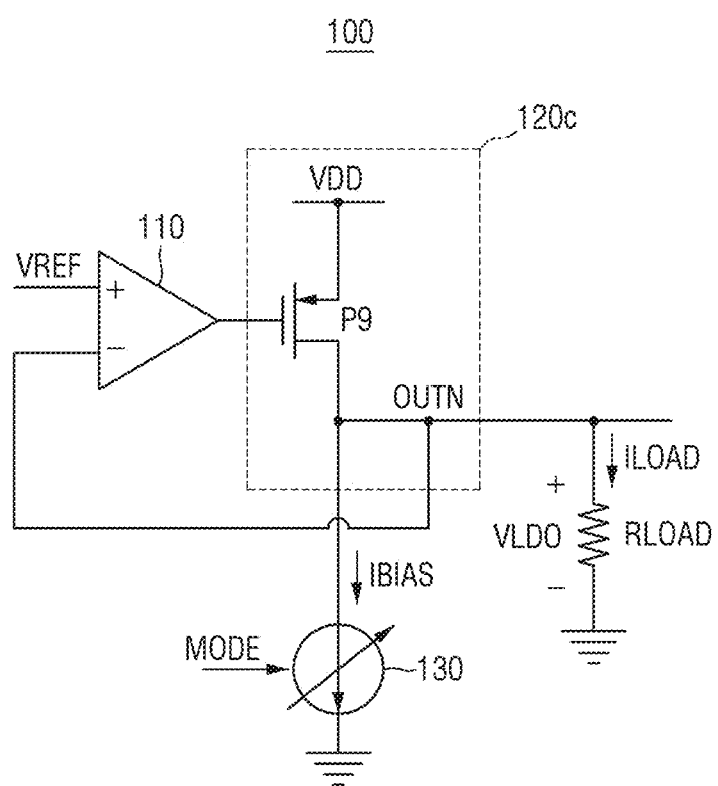
FIG. 10 is a diagram for explaining the semiconductor device according to some example embodiments.

FIG. 10 is a diagram for explaining the semiconductor device according to some example embodiments. Hereinafter, parts different from those of the above-described embodiments will be mainly described.

Referring to FIG. 10, a FVF circuit 120c of the semiconductor device according to some example embodiments may include a transistor P9.

A source terminal of the transistor P9 may be connected to the power supply voltage VDD. A drain terminal of the transistor P9 may be connected to an output node OUTN. In some example embodiments, the transistor P9 may include a P-type transistor. However, some example embodiments are not limited thereto, and the conductive type of the transistor P9 may be modified differently as needed or desired.

That is, the FVF circuit 120c of the semiconductor device according to some example embodiments may be implemented in a form in which the transistor P7 is omitted from the FVF circuit 120b shown in FIG. 9.

Figure 11:
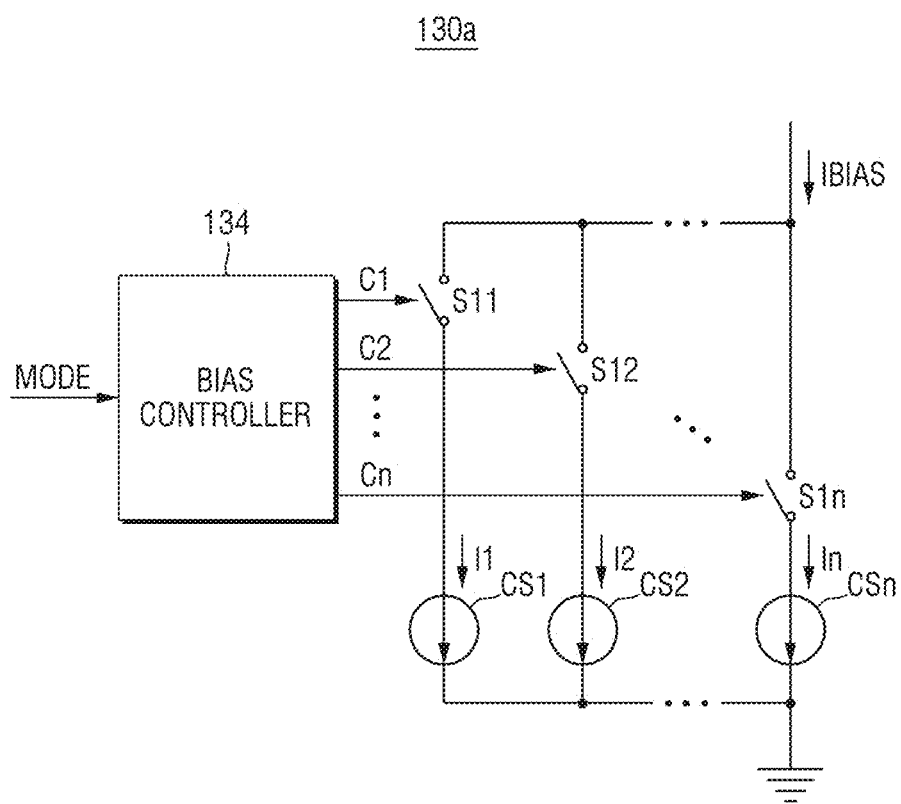
FIG. 11 is a diagram for explaining the semiconductor device according to some example embodiments.
Figure 12:
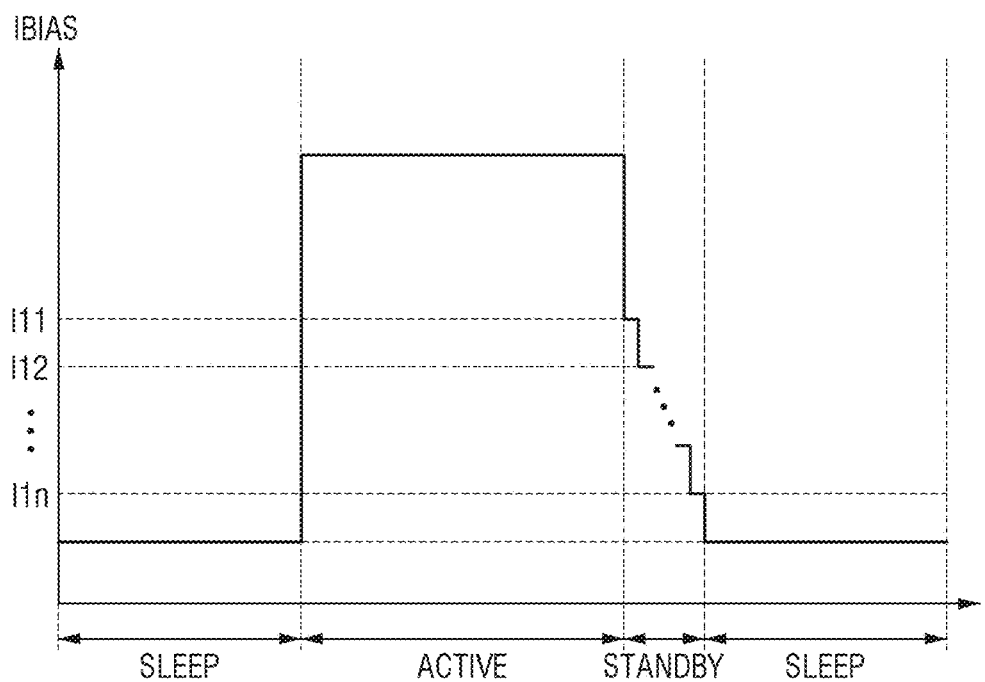
FIG. 12 is a diagram for explaining the operation of the semiconductor device according to some example embodiments.

FIG. 11 is a diagram for explaining a semiconductor device according to some example embodiments. FIG. 12 is a diagram for explaining the operation of the semiconductor device according to some example embodiments. Hereinafter, the parts different from those of the above-described embodiments will be mainly described.

Referring to FIG. 11, a bias current control circuit 130a of the semiconductor device according to some example embodiments may operate inn (n is a natural number of 4 or more) modes depending on the operating state of the load connected to the output node OUTN.

To perform such an operation, the bias current control circuit 130a may include n current sources CS1 to CSn and n switches S11 to S1n. Since the configuration of the n current sources CS1 to CSn, and the operation in which the bias current control circuit 130a turns on the n switches S11 to S1n to activate the n current sources CS1 to CSn are the same, or substantially the same, as those of the above-described embodiments, repeated explanation will not be provided.

Referring to FIG. 12, a standby bias current whose magnitude gradually decreases by the bias current control circuit 130a shown in FIG. 11 may flow through the FVF circuit of the semiconductor device according to some example embodiments. In other words, there may be multiple standby modes between the active mode and the sleep mode.

Figure 13:
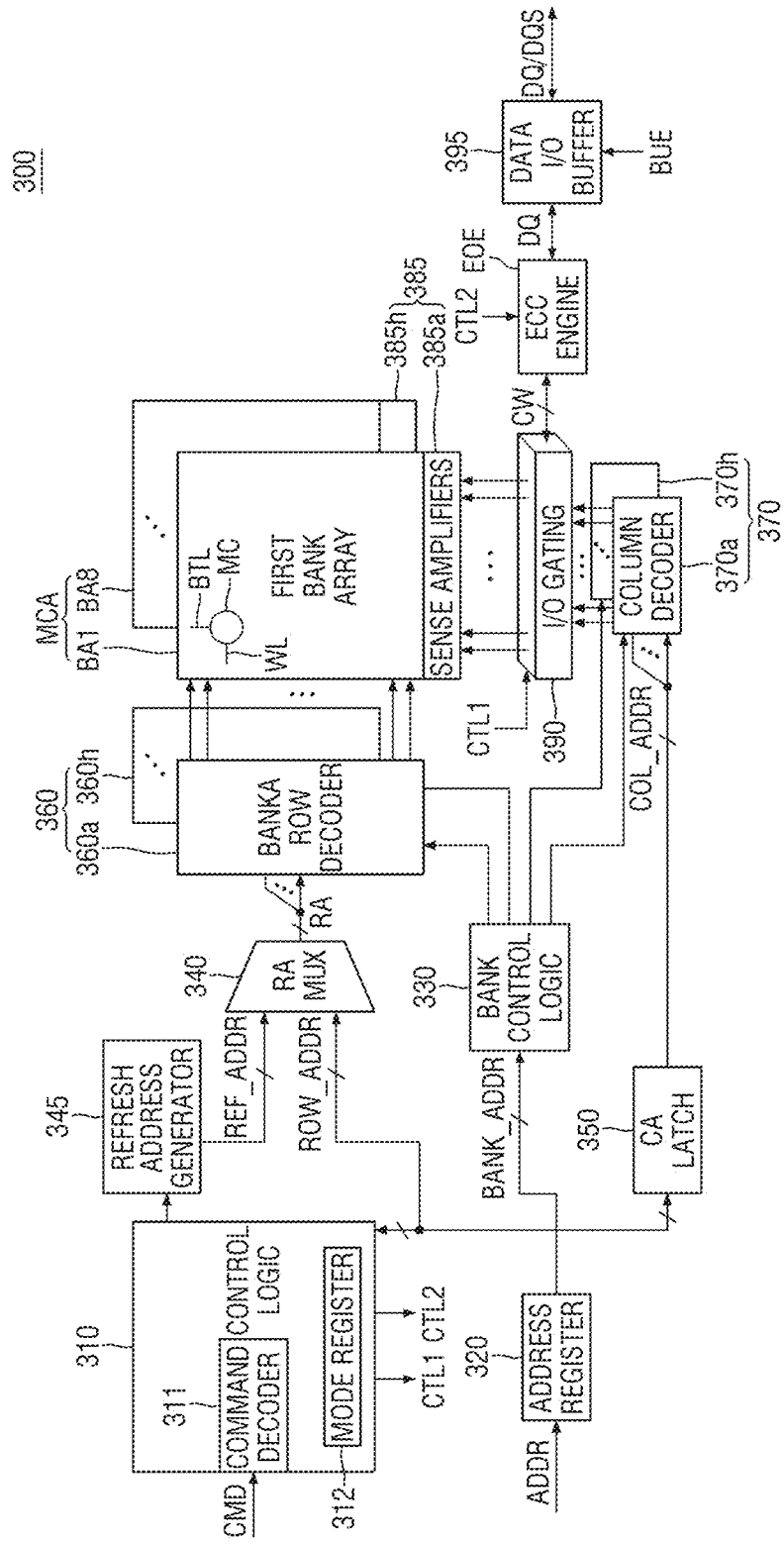
FIG. 13 is a diagram for explaining the memory device according to some example embodiments.
Figure 14:
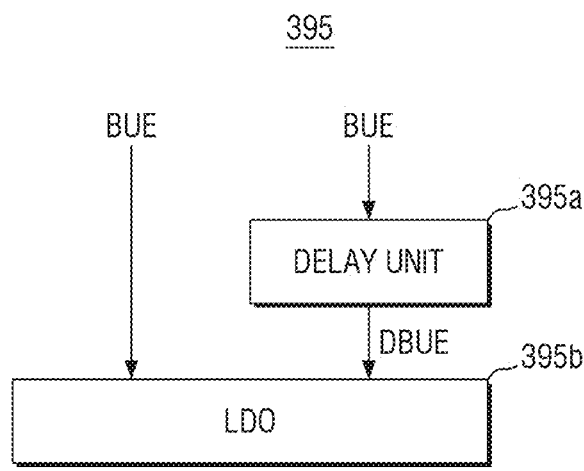
FIG. 14 is a diagram for explaining a data input/output buffer of FIG. 13.

FIG. 13 is a diagram for explaining the memory device according to some example embodiments. FIG. 14 is a diagram for explaining a data input/output buffer of FIG. 13.

First, referring to FIG. 13, the memory device 300 may include a control logic 310, an address register 320, a bank control logic 330, a row address multiplexer 340, a refresh address generator 345, a column address latch 350, a row decoder 360, a column decoder 370, a sense amplifier 385, an input/output gating circuit 390, a memory cell array MCA, an ECC engine ECE, and a data input/output buffer 395.

The memory cell array MCA may include a plurality of memory cells MC for storing the data. For example, the memory cell array MCA may include the first to eighth bank arrays BA1 to BA8. Each of the first to eighth bank arrays BA1 to BA8 may include a plurality of word lines WL, a plurality of bit lines BTL, and a plurality of memory cells MC placed in a region in which the word lines WL and the bit lines BTL intersect.

The memory cell array MCA may include the first to eighth bank arrays BA1 to BA8. Although FIG. 13 shows a memory device 300 including eight bank arrays BA1 to BA8, some example embodiments are not limited thereto, and the memory device 300 may include an arbitrary number of bank arrays.

The control logic 310 may control the operation of the memory device 300. For example, the control logic 310 may generate control signals CTL1 and CTL2 so that the memory device 300 performs an operation of writing the data or an operation of reading the data. The control logic 310 may include a command decoder 311 that decodes the command CMD received from the external host device, and a mode register 312 for setting the operating mode of the memory device 300.

For example, the command decoder 311 may decode a write enable signal, a row address strobe signal, a column address strobe signal, a chip selection signal, and the like to generate control signals corresponding to the command CMD. The control logic 310 may receive a clock signal and a clock enable signal for synchronously driving the memory device 300.

Further, the control logic 310 may control the refresh address generator 345 to generate a refresh row address REF_ADDR in response to the refresh command.

The address register 320 may receive an address ADDR from an external host device. For example, the address register 320 may receive the address ADDR including a bank address BANK_ADDR, a row address ROW_ADDR, and a column address COL_ADDR. The address register 320 may provide the received bank address BANK_ADDR to the bank control logic 330, provide the received row address ROW_ADDR to the row address multiplexer 340, and provide the received column address COL_ADDR to the column address latch 350.

The bank control logic 330 may generate bank control signals in response to the bank address BANK_ADDR received from the address register 320. In response to such bank control signals, the bank row decoder corresponding to the bank address BANK_ADDR among the first to eighth bank row decoders 360a to 360h is activated, and the bank column decoder corresponding to the bank address BANK_ADDR among the first to eighth bank column decoders 370a to 370h may be activated.

The row address multiplexer 340 may receive the row address ROW_ADDR from the address register 320 and receive the refresh row address REF_ADDR from the refresh address generator 345. The row address multiplexer 340 may selectively output the row address ROW_ADDR received from the address register 320 or the refresh row address REF_ADDR received from the refresh address generator 345 as the row address RA. The row address RA that is output from the row address multiplexer 340 may be applied to each of the first to eighth bank row decoders 360a to 360h.

The refresh address generator 345 may generate a refresh row address REF_ADDR for refreshing the memory cells. The refresh address generator 345 may provide the refresh row address REF_ADDR to the row address multiplexer 340. Accordingly, the memory cells placed on the word line corresponding to the refresh row address REF_ADDR may be refreshed.

The column address latch 350 may receive the column address COL_ADDR from the address register 320 and temporarily store the received column address COL_ADDR. Further, the column address latch 350 may gradually increase the column address COL_ADDR received in a burst mode. The column address latch 350 may apply a temporarily stored or gradually increased column address COL_ADDR to each of the first to eighth bank column decoders 370a to 370h.

The row decoder 360 may include first to eighth bank row decoders 360a to 360h connected to each of the first to eighth bank arrays BA1 to BA8. The column decoder 370 may include first to eighth bank column decoders 370a to 370h connected to each of the first to eighth bank arrays BA1 to BA8. The sense amplifier 385 may include first to eighth bank sense amplifiers 385a to 385h connected to each of the first to eighth bank arrays BA1 to BA8.

A bank row decoder activated by the bank control logic 330 among the first to eighth bank row decoders 360a to 360h may decode the row address RA that is output from the row address multiplexer 340 to activate the word line corresponding to the row address RA. For example, the activated bank row decoder may apply a word line drive voltage to the word line corresponding to the row address RA.

The bank column decoder activated by the bank control logic 330 among the first to eighth bank column decoders 370a to 370h may activate the bank sense amplifiers 385a to 385h corresponding to the bank address BANK_ADDR and the column address COL_ADDR through the input/output gating circuit 390.

The input/output gating circuit 390 may include input data mask logic, read data latches for storing the data output from the first to eighth bank arrays BA1 to BA8, and write drivers for writing data to the first to eighth bank arrays BA1 to BA8, together with circuits for gating the input and output data.

A code word CW to be read from one bank array of the first to eighth bank arrays BA1 to BA8 is detected by the bank sense amplifier 385a to 385h corresponding to the one bank array, and may be stored in the read data latches.

The ECC engine ECE may perform ECC decoding on the code word CW stored in the read data latches. When an error is detected in data of the code word CW, the ECC engine ECE may provide a corrected data signal DQ to an external memory controller through the data input/output buffer 395.

The data signal DQ to be written to one bank array among the first to eighth bank arrays BA1 to BA8 is provided to the ECC engine ECE, the ECC engine ECE generates parity bits on the basis of the data signal DQ, and provides the data signal DQ and the parity bits to the input/output gating circuit 390. The input/output gating circuit 390 may write the data signal DQ and the parity bits to a subpage of one bank array through the write drivers.

The data signal DQ and the data strobe signal DQS may be provided to the data input/output buffer 395 from the outside (for example, a host) (e.g., received by the input/output buffer 395). In some example embodiments, the data input/output buffer 395 may include a first data input/output buffer (e.g., a data buffer) that receives the data signal DQ from the outside, and a second data input/output buffer (e.g., a data strobe buffer) that receives the data strobe signal DQS from the outside.

The data input/output buffer 395 may buffer or drive the data signal DQ (e.g., write data) in the write operation and provide it to the ECC engine ECE, and may buffer or drive the data signal DQ (e.g., read data) provided from the ECC engine ECE in the read operation and provide it to an external host device.

The data input/output buffer 395 is provided with a buffer enable signal BUE that is activated when the memory device 300 performs a write operation or a read operation, and may operate on the basis of the buffer enable signal BUE. A specific explanation thereof will be provided later.

The data input/output buffer 395 may be provided with such a buffer enable signal BUE from the outside. In some example embodiments, although the data input/output buffer 395 may be provided with such a buffer enable signal BUE from the control logic 310, some example embodiments are not limited thereto. If desired, the data input/output buffer 395 may provide such a buffer enable signal BUE from a constituent element other than the control logic 310.

Referring to FIG. 14, the data input/output buffer 395 may include the above-mentioned LDO regulator 395*b* and a delay unit 395*a*. In some example embodiments, the LDO regulator 395*b* may be included in a second data input/output buffer of the data input/output buffer 395 to which the data strobe signal DQS is provided from the outside.

However, some example embodiments are not limited thereto, and the LDO regulator 395*b* may be included in a first data input/output buffer of the data input/output buffers 395 to which the data signal DQ is provided from the outside. Further, in some example embodiments, the LDO regulator 395*b* may be included in both the first data input/output buffer provided with the data signal DQ from outside and the second data input/output buffer provided with the data strobe signal DQS from outside.

The delay unit 395*a* may generate a delay buffer enable signal DBUE by delaying the buffer enable signal BUE provided from the outside for a predetermined (or, alternatively, desired) time.

The LDO regulator 395*b* may operate in any one mode of the active mode, the standby mode, and the sleep mode, by utilizing such a buffer enable signal BUE and a delay buffer enable signal DBUE as the above-mentioned mode signal (e.g., MODE of FIG. 2). Hereinafter, this operation will be described more specifically referring to FIG. 15.

Figure 15:
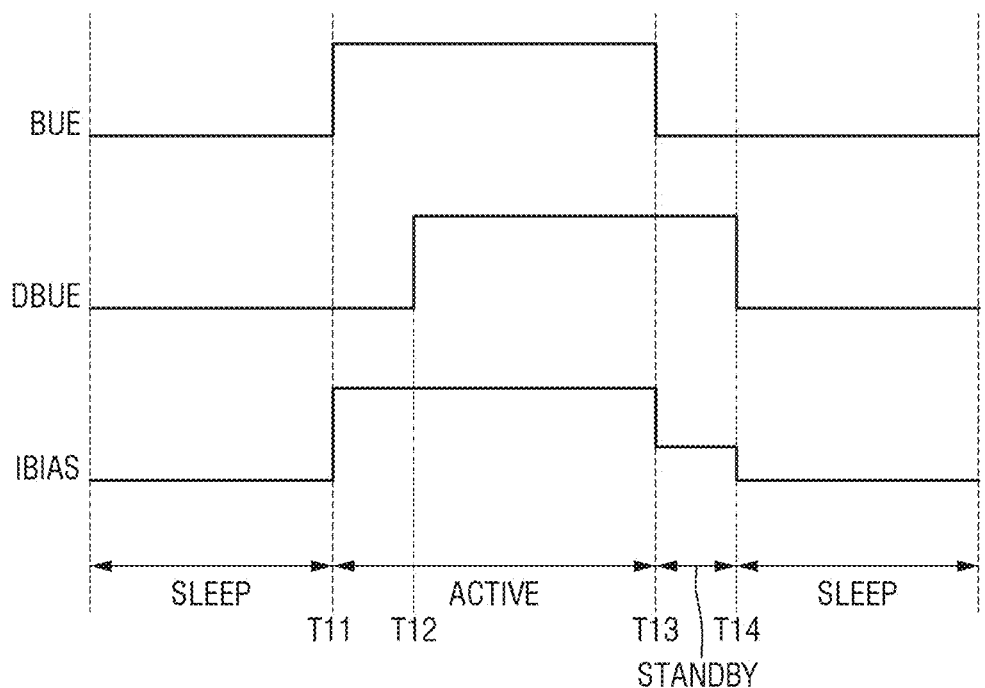
FIG. 15 is a diagram for explaining the operation of the memory device according to some example embodiments.

FIG. 15 is a diagram for explaining the operation of the memory device according to some example embodiments.

Referring to FIG. 15, at a time point T11, the buffer enable signal BUE shifts to a first level (e.g., a logical high level, hereinafter referred to as H) for the memory device 300 to perform, for example, a read operation or a write operation in response to a command applied from the external host device.

On the other hand, the delay buffer enable signal DBUE still maintains the second level (e.g., a logical low level, hereinafter referred to as L) at the time point T11.

The LDO regulator 395*b* operates in an active mode that controls the bias current of a large magnitude to flow through the internal FVF circuit in response to the buffer enable signal BUE shifting to the first level H. That is, the first mode signal described above in some example embodiments is the buffer enable signal BUE of the first level H.

Next, at the time point T12, the delay buffer enable signal DBUE shifts to the first level H. The LDO regulator 395*b* continues the active mode operation regardless of the level of the delay buffer enable signal DBUE, while the buffer enable signal BUE maintains the first level H.

Next, at the time point T13, the operation performed in the memory device 300 in response to the command applied from the external host device is completed, and the buffer enable signal BUE shifts to the second level L.

On the other hand, the delay buffer enable signal DBUE still maintains the first level H at time point T13.

The LDO regulator 395*b* operates in a standby mode which controls the bias current of a small magnitude to flow through the internal FVF circuit, in response to the buffer enable signal BUE shifting to second level L and the delay buffer enable signal DBUE maintaining the first level H. That is, the second mode signal described above in some example embodiments is the buffer enable signal BUE of the second level L and the delay buffer enable signal DBUE of the first level H.

Next, at the time point T14, the delay buffer enable signal DBUE shifts to the second level L. The LDO regulator 395*b* operates in the sleep mode which controls the bias current of small or very small magnitude to flow through the internal FVF circuit, in response to the buffer enable signal BUE maintaining the second level L and the delay buffer enable signal DBUE shifting to the second level L. That is, the third mode signal described above in some example embodiments is the buffer enable signal BUE of the second level L and the delay buffer enable signal DBUE of the second level L.

Figure 16:
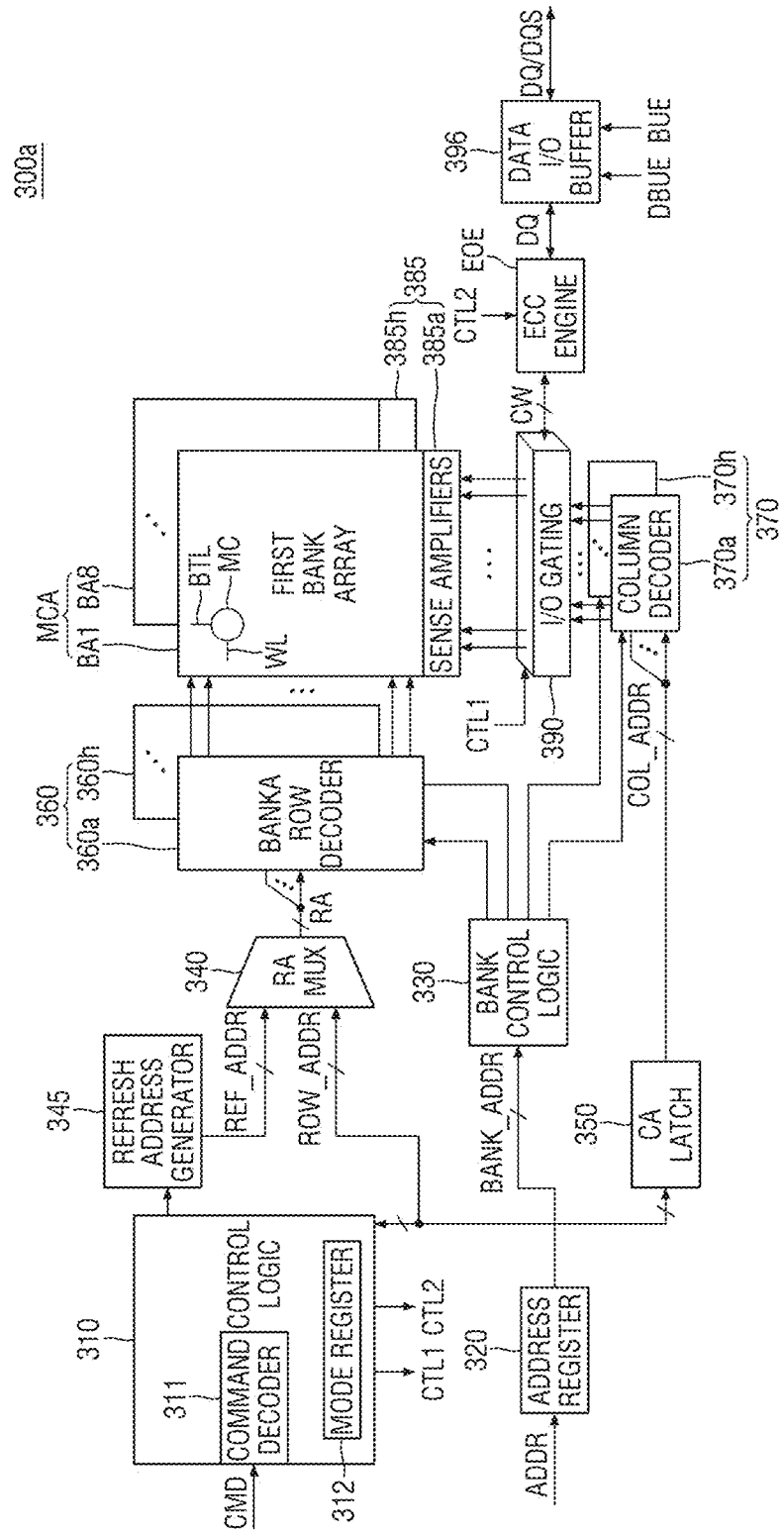
FIG. 16 is a diagram for explaining the memory device according to some example embodiments.

FIG. 16 is a diagram for explaining a memory device according to some example embodiments. Hereinafter, differences from the above-described embodiments will be mainly described.

Referring to FIG. 16, a data input/output buffer 396 of a memory device 300*a* according to some example embodiments may be provided with the buffer enable signal BUE and the delay buffer enable signal DBUE from the outside (e.g., received by the data input/output buffer 396).

That is, in some example embodiments, the data input/output buffer 396 does not delay the buffer enable signal BUE, which is provided from the outside, inside to generate the delay buffer enable signal DBUE, but receives both the buffer enable signal BUE and the delay buffer enable signal DBUE from the outside. Such a buffer enable signal BUE and a delay buffer enable signal DBUE may be provided, for example, from the control logic 310.

In some example embodiments, although the buffer enable signal BUE and the delay buffer enable signal DBUE are taken as an example of the mode signal, the example embodiments are not limited thereto. If necessary or desired, the buffer enable signal BUE and the delay buffer enable signal DBUE may be modified to other signals.

Figure 17:
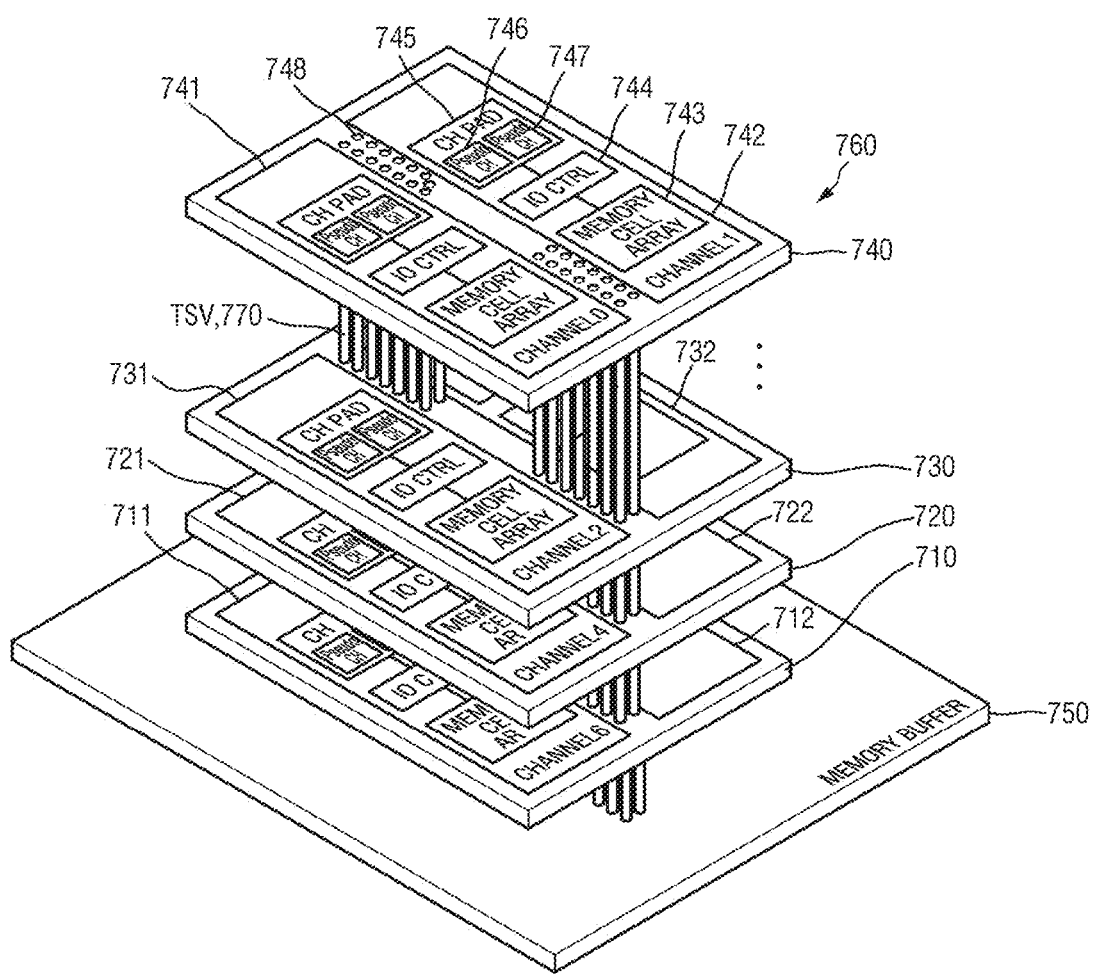
FIG. 17 is a diagram for explaining the memory device according to some example embodiments.

FIG. 17 is a diagram for explaining a memory device according to some example embodiments.

Referring to FIG. 17, a memory device 760 may include a plurality of stacked memory layers 710, 720, 730 and 740. The memory device 760 may be, for example, an HBM (High Bandwidth Memory). The memory layers 710, 720, 730 and 740 may form a plurality of independent interfaces called channels.

Each of the memory layers 710, 720, 730 and 740 may include two channels 711-712, 721-722, 731-732 and 741-742. Although FIG. 17 shows an example in which four memory layers 710, 720, 730, and 740 are stacked in the memory device 760 and are made up of eight channels, some example embodiments are not limited thereto. According to some example embodiments, two to eight memory layers may be stacked in the memory device 760.

Each of the channels 711, 712, 721, 722, 731, 732, 741 and 742 may include a memory cell array 743 that operates independently for each channel, an input/output control unit 744 for controlling the memory cell array 743 independently for each channel, and a channel pad unit 745 that provides a channel for the memory cell array 743.

The memory cell array 743 includes memory cells connected to the plurality of word lines and bit lines, and the memory cells may be grouped into a plurality of memory banks and/or memory blocks. A row decoder, a column decoder, a sense amplifier, and the like for accessing the memory cells may be placed in the region of the memory cell array 743.

The input/output control unit 744 may include RAS control logic, CAS control logic, and the like. The channel pad unit 745 may include pads arranged in the form of a matrix including a plurality of rows and a plurality of columns. Each of the pads of the channel pad unit 745 may be connected to an electrode 748 and a through silicon via (TSV) 770 through wiring for signal routing.

The memory device 760 may further include a memory buffer 750 placed at the lower ends of the stacked memory layers 710, 720, 730 and 740. The memory buffer 750 includes an input buffer (or receiver) that receives command, address, clock, and data from the control logic, and may buffer the received command, address, clock, and data, and provide them to the channels 711, 712, 721, 722, 731, 732, 741 and 742.

In some example embodiments, the memory buffer 750 may include the LDO regulators described above. The memory buffer 750 may provide signal distribution and data input/output functions to the channels 711, 712, 721, 722, 731, 732, 741 and 742 through electrodes 748 and the through silicon vias 770.

The memory buffer 750 may communicate with the control logic through conductive means formed on the outer surface of the memory device 760, for example, bumps or solder balls.

Each of the memory layers 710, 720, 730 and 740 includes two channels 711, 712, 721, 722, 731, 732, 741 and 742, and the single channel may be made up of two pseudo channels.

Assuming that the number of data input/output DQ pads included in the region of the channel pad unit 745 of each of the channels 711, 712, 721, 722, 731, 732, 741 and 742 is, for example, 128, one hundred and twenty eight DQ pads of the channel pad units 745 of the respective channels 711, 712, 721, 722, 731, 732, 741 and 742 are divided into two groups of pseudo channels 746 and 747, and the number of each DQ pads of the pseudo channels 746 and 747 may be 64. Here, each of the channels 711, 712, 721, 722, 731, 732, 741 and 742 may be provided with data through the eight DQ pads.

Figure 18:
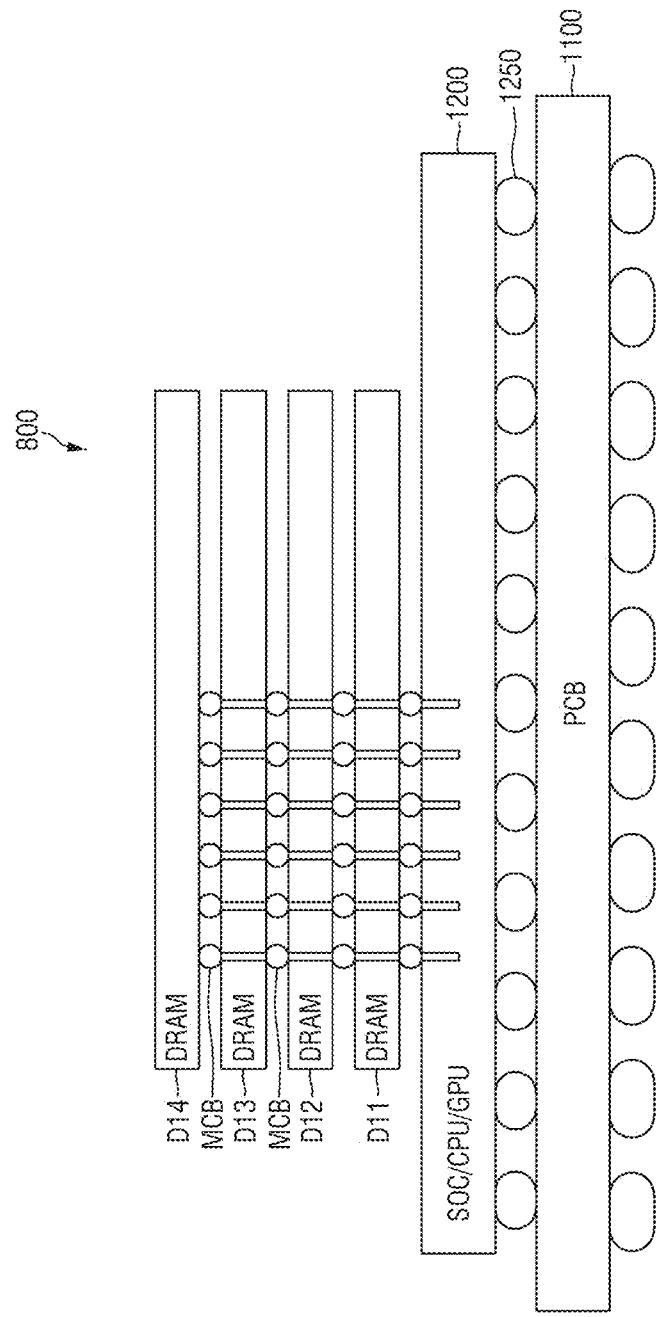
FIGS. 18 and 19 are diagrams showing an example in which the memory device according to some example embodiments is applied to a 3D chip structure.
Figure 19:
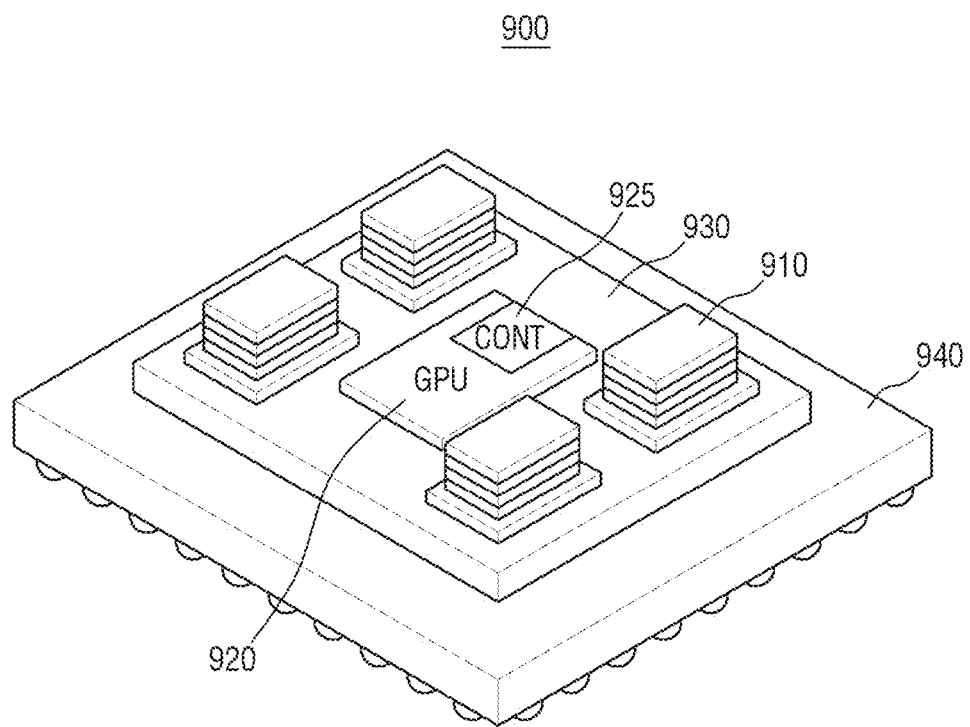

FIGS. 18 and 19 are diagrams showing an example in which the memory device according to some example embodiments is applied to a 3D chip structure.

FIG. 18 shows a 3D chip structure 800 in which a host and a HBM are directly connected without intervention of an interposer layer.

Referring to FIG. 18, a host die 810 which may be a SoC, a CPU or a GPU is placed on the upper part of a PCB 820 through flip chip bumps FB.

Memory dies D11 to D14 for forming an HBM structure as described referring to FIG. 17 are stacked on the upper part of the host die 810.

Although the buffer die or logic die corresponding to the memory buffer 750 of FIG. 17 is omitted from FIG. 18, the buffer die or logic die may be placed between the memory die D11 and the host die 810.

In order to implement the HBM structure, TSV lines called through silicon via may be formed on the memory dies D11 to D14. The TSV lines may be electrically connected to micro bumps MCB formed between the memory dies.

FIG. 19 is a structural diagram showing an example of a semiconductor package including a stacked memory device according to some example embodiments of the present disclosure.

Referring to FIG. 19, the semiconductor package 900 may include one or more stacked memory devices 910 and a graphics processor (GPU) 920, and the graphics processor 920 may include a memory controller 925.

The stacked memory device 910 and the graphic processor 920 are mounted on the interposer 930, and the interposer 930 on which the stacked memory device 910 and the graphic processor 920 are mounted may be mounted on a package substrate 940.

The stacked memory device 910 may be implemented in various forms, and in some example embodiments, the stacked memory device 910 may be an HBM type memory device in which a plurality of layers are stacked. Therefore, the stacked memory device 910 includes a buffer die and a plurality of memory dies, and the plurality of memory dies may include a memory cell array and an error correction circuit, respectively.

A plurality of stacked memory devices 910 may be mounted on the interposer 930, and the graphic processor 920 may communicate with the plurality of stacked memory devices 910. In some example embodiments, each of the stacked memory devices 910 and the graphics processor 920 may include a PHY region, and a communication may be performed between the stacked memory devices 910 and the graphics processor 920 through the PHY region.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The semiconductor device 100 (or other circuitry, for example, the FVF circuit 120 (120a, etc.), bias current control circuit 130, bias controller 134, memory device 300, 300a, or internal features such as delay unit 395a and LDO 395b, or other circuitry discussed herein) may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In concluding the detailed description, those skilled in the art will appreciate that many variations and modifications may be made to the example embodiments without substantially departing from the principles of the present disclosure. Therefore, the example embodiments of the disclosure are used in a generic and descriptive sense only and not for purposes of limitation.

What is claimed is:

1. A semiconductor device comprising:
   an error amplifier configured to receive a voltage of an output node and a reference voltage;
   a flipped voltage follower (FVF) circuit configured to receive an output of the error amplifier and maintain the voltage of the output node at the reference voltage; and
   a bias current control circuit configured to
      receive a first mode signal, a second mode signal, and a third mode signal,
      control a magnitude of a bias current flowing through the FVF circuit based on the first mode signal, the second mode signal, and the third mode signal,
      control the bias current of a first magnitude to flow through the FVF circuit, in response to the first mode signal,
      control the bias current of a second magnitude smaller than the first magnitude to flow through the FVF circuit, in response to the second mode signal, and
      control the bias current of a third magnitude smaller than the second magnitude to flow through the FVF circuit, in response to the third mode signal.

2. The semiconductor device of claim 1, wherein the bias current control circuit includes a first current source, a second current source, and a third current source,
   the first current source, the second current source, and the third current source are configured to be activated in response to the first mode signal,
   the first current source is configured to be deactivated and the second and third current sources are configured to be activated in response to the second mode signal, and
   the first and second current sources are configured to be deactivated and the third current source is configured to be activated in response to the third mode signal.

3. The semiconductor device of claim 2, wherein each of the first current source, the second current source, and the third current source are a current mirror.

4. The semiconductor device of claim 1, wherein the bias current control circuit includes
   a first current source configured to provide a first current of the first magnitude,
   a second current source configured to provide a second current of the second magnitude, and
   a third current source configured to provide current of a third magnitude,
   the first current source is configured to be activated and the second and third current sources are configured to be deactivated, in response to the first mode signal,
   the second current source is configured to be activated and the first and third current sources are configured to be deactivated, in response to the second mode signal, and
   the third current source is configured to be activated and the first and second current sources are configured to be deactivated, in response to the third mode signal.

5. The semiconductor device of claim 1, wherein the first mode signal, the second mode signal, and the third mode signal are configured to be determined based on a signal level of a first signal, and a signal level of a second signal different from the first signal.

6. The semiconductor device of claim 5, wherein the second signal is configured to be generated by delaying the first signal.

7. The semiconductor device of claim 6, wherein the first mode signal is configured to be generated in response to the first signal of a first level,
   the second mode signal is configured to be generated in response to the first signal of a second level different from the first level and the second signal of the first level, and
   the third mode signal is configured to be generated in response to the first signal of the second level and the second signal of the second level.

8. The semiconductor device of claim 1, wherein the bias current control circuit is configured to receive a fourth mode signal, and
   the bias current control circuit is configured to control the bias current of a fourth magnitude smaller than the third magnitude to flow through the FVF circuit, in response to the fourth mode signal.

9. A semiconductor device comprising:
   an error amplifier configured to receive a voltage of an output node and a reference voltage;
   a first transistor configured to maintain the voltage of the output node at the reference voltage, using a power supply voltage based on an output of the error amplifier; and
   a bias current control circuit configured to
      receive a first mode signal, a second mode signal, and a third mode signal,
      control a magnitude of a bias current flowing through the first transistor based on the first mode signal, the second mode signal, and the third mode signal,
      control the bias current of a first magnitude to flow through the first transistor, in response to the first mode signal,
      control the bias current of a second magnitude smaller than the first magnitude to flow through the first transistor, in response to the second mode signal, and
      control the bias current of a third magnitude smaller than the second magnitude to flow through the first transistor, in response to the third mode signal.

10. The semiconductor device of claim 9, further comprising:
    a second transistor connected between the power supply voltage and the first transistor, and having a gate electrode connected to one end of the first transistor.

11. The semiconductor device of claim 10, further comprising:

a third transistor connected between the power supply voltage and one end of the first transistor, and having gate electrode connected to a gate electrode of the second transistor.

12. The semiconductor device of claim 11, further comprising:
a fourth transistor connected between one end of the third transistor and one end of the first transistor.

13. The semiconductor device of claim 12, wherein a conductive type of the fourth transistor is different from conductive types of the first transistor, the second transistor, and the third transistor.

14. The semiconductor device of claim 9, wherein the first mode signal, the second mode signal, and the third mode signal are determined based on a signal level of a first signal, and a signal level of a second signal different from the first signal.

15. The semiconductor device of claim 14, wherein the second signal is configured to be generated by delaying the first signal.

16. The semiconductor device of claim 15, wherein the first mode signal is configured to be generated in response to the first signal of a first level,
the second mode signal is configured to be generated in response to the first signal of a second level different from the first level, and the second signal of the first level, and
the third mode signal is configured to be generated in response to the first signal of the second level and the second signal of the second level.

17. A memory device comprising:
a memory cell;
a data input/output buffer configured to buffer data to be written to the memory cell or buffer data read from the memory cell; and
a regulator in the data input/output buffer and is configured to receive first and second signals,
wherein the regulator includes
an error amplifier configured to receive a voltage of an output node and a reference voltage;
an FVF circuit configured to receive an output of the error amplifier and maintain the voltage of the output node at the reference voltage; and
a bias current control circuit configured to control a magnitude of a bias current flowing through the FVF circuit, the bias current control circuit being configured to
control the bias current of a first magnitude to flow through the FVF circuit, in response to the first signal of a first level,
control the bias current of a second magnitude smaller than the first magnitude to flow through the FVF circuit, in response to the first signal of a second level different from the first level and the second signal of the first level, and
control the bias current of a third magnitude smaller than the second magnitude to flow through the FVF circuit, in response to the first signal of the second level and the second signal of the second level.

18. The memory device of claim 17, wherein the second signal is configured to be generated by delaying the first signal.

19. The memory device of claim 18, wherein the first signal includes a buffer enable signal, the buffer enable signal configured to be generated in response to activation of the memory device, and
the second signal is configured to receive generated by delaying the buffer enable signal for a time.

20. The memory device of claim 17, wherein the regulator includes an LDO (Low Drop Out) regulator, and
the LDO regulator is in a data strobe buffer of the data input/output buffer, and is configured to receive a data strobe signal.

* * * * *